United States Patent [19]

Weichold et al.

[11] Patent Number: 5,179,043
[45] Date of Patent: Jan. 12, 1993

[54] VAPOR DEPOSITED MICRO HEAT PIPES

[75] Inventors: Mark H. Weichold; George P. Peterson, both of College Station; Arnab K. Mallik, Bryan, all of Tex.

[73] Assignee: The Texas A&M University System, College Station, Tex.

[21] Appl. No.: 714,912

[22] Filed: Jun. 13, 1991

Related U.S. Application Data

[62] Division of Ser. No. 380,189, Jul. 14, 1989, abandoned.

[51] Int. Cl.$^5$ ........................................ H01L 21/461
[52] U.S. Cl. .................................. 437/225; 437/902; 437/203; 165/104.26; 165/104.33; 257/714
[58] Field of Search ............... 437/902, 225, 67, 203; 165/104.33, 104.26; 357/82

[56] References Cited

U.S. PATENT DOCUMENTS

| | | | |
|---|---|---|---|
| 4,450,472 | 5/1984 | Tuckerman et al. | 357/82 |
| 4,573,067 | 2/1986 | Tuckerman et al. | 357/82 |

FOREIGN PATENT DOCUMENTS

| | | | |
|---|---|---|---|
| 61-183949 | 8/1986 | Japan | 437/902 |
| 62-16551 | 6/1987 | Japan . | |

OTHER PUBLICATIONS

Ghandhi, S. K., et al., VLSI Fabrication Principles, 1983, John Wiley & Sons, pp. 372–373.
Cotter, T. P., "Principles and Prospects of . . . ", Proc. 5th Int'l Heat Pipe Conf., Tsukuba, Japan, 1984, pp. 328–335.

*Primary Examiner*—T. N. Quach
*Attorney, Agent, or Firm*—Arnold, White & Durkee

[57] ABSTRACT

A micro heat pipe, formed in a semiconductor substrate, carries heat from a region of heat flux in the substrate to a region of lower heat flux. The micro heat pipe is formed by cutting a groove into the substrate opposite a site where devices have been formed or are to be formed. Vapor deposited layers are then formed on the substrate to define the micro heat pipe. A fraction of the pipe is filled with a coolant or other working fluid and the pipe is sealed. A micro heat pipe may also be formed by etching a channel down into the substrate, oxidizing the surfaces of the channel, charging the channel with a cooling medium to fill a fraction of the channel and sealing the end of the channel. In operation, the working fluid evaporates in the region of high heat flux and condenses in the region of lower heat flux resulting in the transfer or redistribution of the fluid's heat of vaporization.

3 Claims, 3 Drawing Sheets

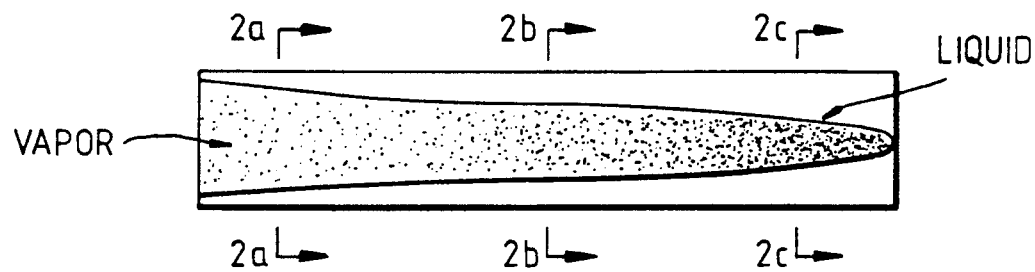
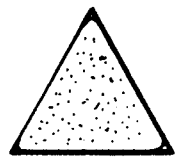 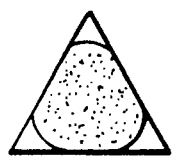 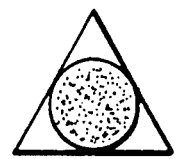
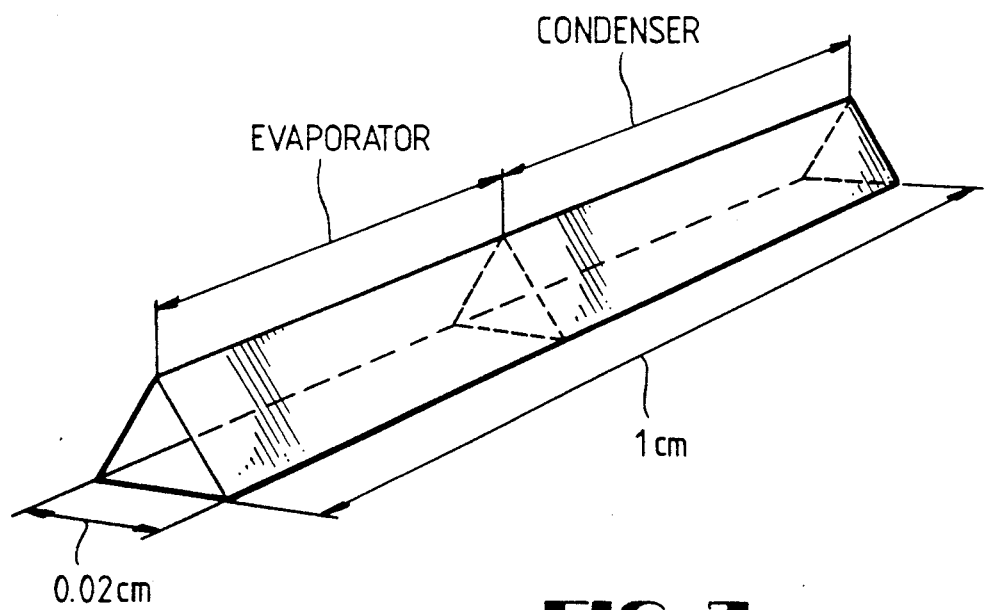

VAPOR DEPOSITED MICRO HEAT PIPES

This is a division of application Ser. No. 380,189, filed Jul. 14, 1989, now abandoned.

BACKGROUND OF THE INVENTION

1. Field of the Invention

This invention relates to a method of and a structure for cooling integrated circuit devices. More particularly, it relates to micro heat pipes formed in an integrated circuit chip, a method of cooling integrated circuits using micro heat pipes, and a method of forming the micro heat pipes.

2. Prior Art

As the size of electronic components decreases and the concomitant component density increases, integrated circuits tend to form local regions on the semiconductor device that produce relatively large amounts of heat. These hot spots can degrade device performance and can lead to device failure. It would therefore be advantageous to conduct this heat from regions of a semiconductor chip generating relatively large amounts of heat to regions of the chip producing relatively small amounts of heat. In this way, the heat generated in an integrated circuit is spread more evenly throughout the chip.

Cotter described very small, micro heat pipes for cooling microelectronic devices. Cotter, T. P., 1984, "Principals and Prospects of Micro Heat Pipes," Proc. 5th Int'l Heat Pipe Conf., Tsukuba, Japan, pp.328-335. He defined a micro heat pipe as "one so small that the mean curvature of the vapor-liquid interface is necessarily comparable in magnitude to the reciprocal of the hydraulic radius of the total flow channel." In practical terms, a micro heat pipe is a wickless, non-circular channel with a diameter of 10–500 micrometers and a length of about 10–20 millimeters.

Cotter proposed micro heat pipes for cooling the volumetric heating produced in a parallel-processing microelectronic component. The evaporator portion of the heat pipe would be an integral part of the device. Heat would be removed from within the device by an array of micro heat pipes.

Cotter derived an approximate theoretical result for the maximum heat transport capability, $q_m$ of a micro heat pipe. For a micro heat pipe with an equilateral triangular shape with sides 0.2 mm, length 10 mm, and an optimum amount of methanol as the working fluid, Cotter predicted a $q_m$ of 0.03 watts. He reasoned that, when used in a solid in an array of parallel pipes (about 10% by volume), these micro heat pipes could provide a few tens of watts per cubic centimeter of cooling.

Besides the difficulties of manufacturing, cleaning and filling these micro heat pipes (Cotter believed that existing micro-mechanical technology as of 1984 could overcome these problems), the micro heat pipe is very sensitive to percent fill of the working fluid. The liquid-vapor interface changes continually along the pipe, and care must be exercised to ensure proper wetted conditions without flooding the micro channels.

It would therefore be advantageous to provide a micro heat pipe that is relatively easy to construct. It would also be advantageous to provide a controllable method of charging a micro heat pipe with a cooling medium.

SUMMARY OF THE INVENTION

The present invention provides a method of forming a micro heat pipe. A groove that may be roughly trapezoidal in cross-section is cut in an integrated circuit chip on the surface opposite a source of heat on the chip. Next, a series of metallization layers, preferably aluminum or copper, are vapor deposited on the surface of the chip, as well as on the side-walls and bottom of the groove, to partially fill and seal the surface of the chip to form a heat pipe that is roughly triangular in cross-section, but whose walls are concave inward. One end of the heat pipe is then sealed and the chip is evacuated and immersed in a bath containing a cooling medium, in a preferred embodiment, ultra-pure water or methanol. Preferably, an aluminmum heat pipes uses water as the cooling medium or working fluid and a copper heat pipe uses methanol as the working fluid. Finally, the chip and bath are heated for a selected time to evaporate the cooling medium to provide a controlled loading or charging of coolant in the heat pipe of about 20% and the heat pipe is sealed.

The present invention also provides a novel heat pipe comprising a groove cut in a semiconductor, a vapor deposited layer that forms a channel that is roughly triangular in cross-section, and a selected quantity of a cooling medium. Such a micro heat pipe helps eliminate localized hot spots on semiconductor devices significantly improving their reliability. The micro heat pipe also improves the performance of the semiconductor devices, i.e., speed of operation and power handling capability. Further, because the thermal energy generated by the chip can be removed efficiently, the overall power dissipation of the chip can be increased significantly. Finally, because the micro heat pipe passages are lined with a thin layer of metal, problems associated with the migration of the working fluid throughout the semiconductor material is significantly reduced.

The present invention also provides a means of cooling a localized hot spot on a semiconductor by locating one end of a micro heat pipe near the hot spot or source of heat and locating the other end of the micro heat pipe near a heat sink.

Another embodiment of the present invention presents a vertical heat pipe. The vertical heat pipe is etched into the semiconductor material and the pipe is oxidized to avoid migration of the working fluid into the semiconductor material. The semiconductor device is evacuated and an appropriate amount of a working fluid is charged into the pipe. The pipe is then sealed providing a micro heat pipe from a heat source to a heat sink.

BRIEF DESCRIPTION OF THE DRAWINGS

FIG. 2 is a diagram of the liquid-vapor interface in the heat pipe of the present invention in operation with FIGS. 2a, 2b and 2c showing cross-sectional views of the liquid vapor interface.

FIG. 3 is a three-dimensional diagram of a micro heat pipe of the present invention.

DETAILED DESCRIPTION OF PREFERRED EMBODIMENTS

Figure 1:
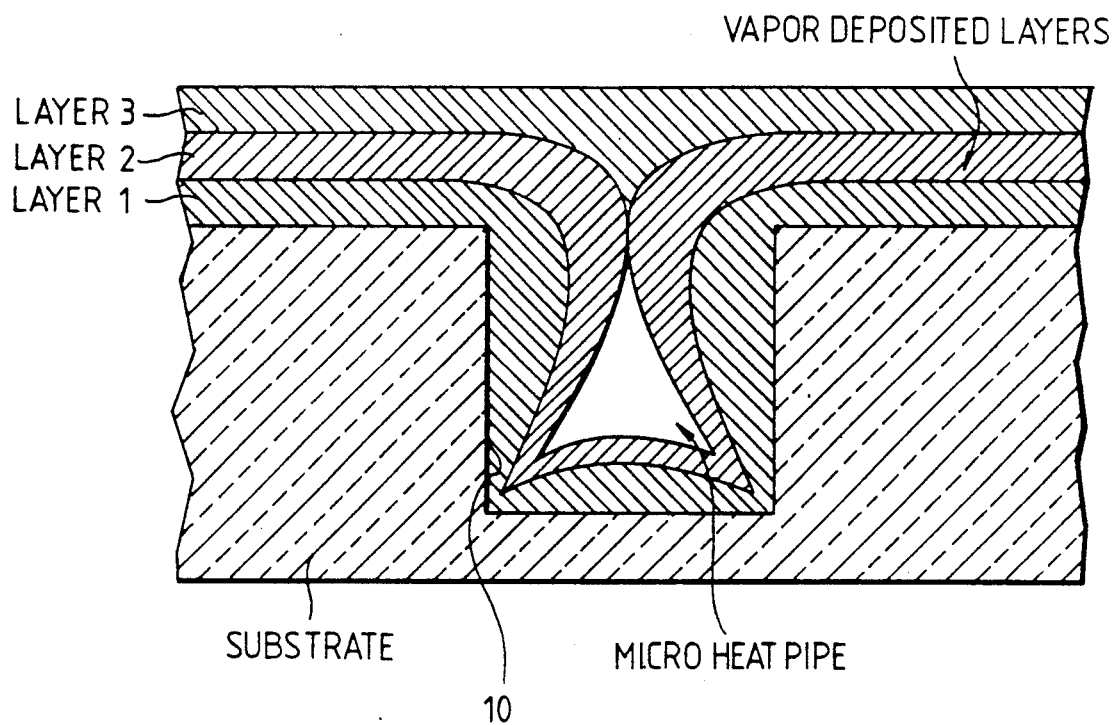
FIG. 1 is a cross-sectional diagram of a heat pipe of the present invention.

FIG. 1 depicts an end-view of an embodiment of a micro heat pipe of the present invention. The micro heat pipe is formed on the surface of a semiconductor opposite to that on which semiconductor devices have been formed or are to be formed. In a preferred embodiment, a semiconductor chip will include a plurality of such micro heat pipes.

Figure 4:
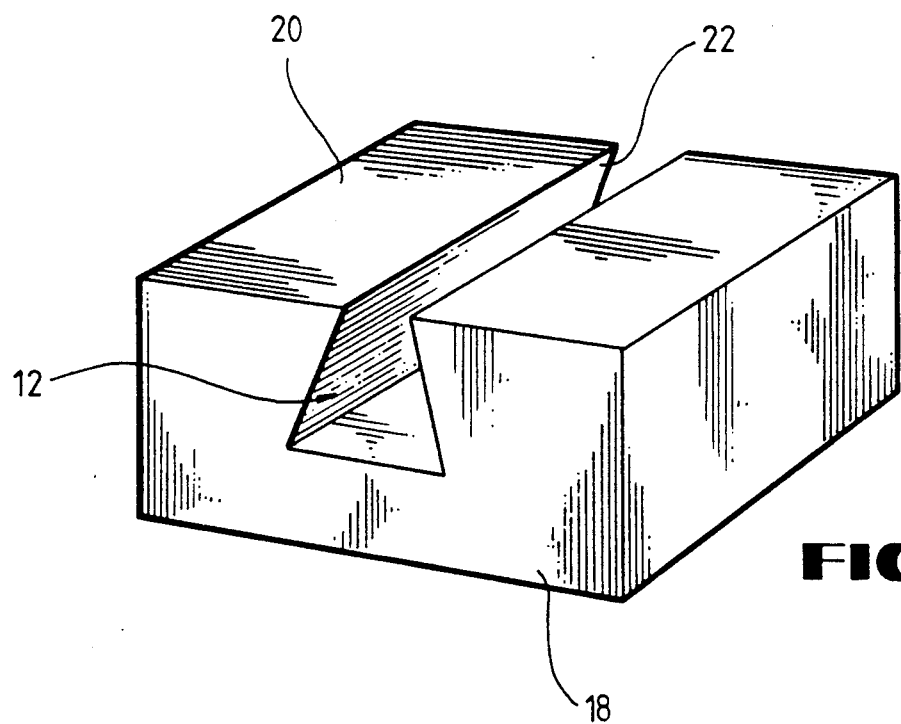
FIG. 4 is a partial cutaway three-dimensional diagram of a trapezoidal groove prior to deposition of a micro heat pipe.

The first step in forming a micro heat pipe of the present invention is to cut a groove 10 into the semiconductor substrate. FIG. 1 depicts a rectangular groove 10 while FIG. 4 depicts a trapezoidal groove 12. This groove may preferably be cut into the semiconductor chip using a dicing saw, Model 1100, made by Micro Automation, a division of General Signal, in Santa Clara, Calif. This dicing saw is capable of micromachining grooves of the preferred size and shape. It includes a magnifying scope to assist in observing the cutting of the grooves.

As shown in FIG. 4, the groove may preferably take the cross-sectional shape of a trapezoid. The trapezoidal groove results in a roughly triangular micro heat pipe that may be approximately 100 micrometers on a side. In this case, the trapezoid is approximately 100 micrometers across at the top, approximately 120 micrometers across at the bottom, and approximately 150 micrometers deep. These dimensions are provided by way of illustration and not by way of limitation. The micro heat pipe will be formed in the same way as described below with regard to FIG. 1.

As shown in FIG. 4, the groove is cut into a semiconductor substrate 18. The groove is cut into the surface 20 and the integrated circuit of the device is formed into the opposite surface. The region of the groove adjacent the surface 20 of the substrate may be referred to as the top 22 of the groove.

Once the grooves are cut, a series of layers of a heat-conductive material are formed on the chip. These layers may be formed by vapor deposition, i.e., evaporation or sputtering, although other processes such as plating or chemical vapor deposition (CVD) may be used. The heat-conductive material may preferably be aluminum, although other materials may be used, such as copper. As shown in FIG. 1, the material forms in the grooves and seals the grooves leaving channels or micro heat pipes and these channels are open at one or at both ends. These channels are tubes that are roughly triangular in cross-section. FIG. 1 shows 3 vapor deposited layers but more layers may be required to properly form the micro heat pipe. As used herein, the term "micro heat pipes" may refer to these tubes or to the entire structure, including the working fluid in the tubes. Although the deposition of the material is a continuous process, the term "layers" is used to help visualize how the material builds up over time. On the other hand, multiple layers of different materials may be formed to match the adhesion characteristics of some materials with superior wetting properties of other materials.

Figure 6:
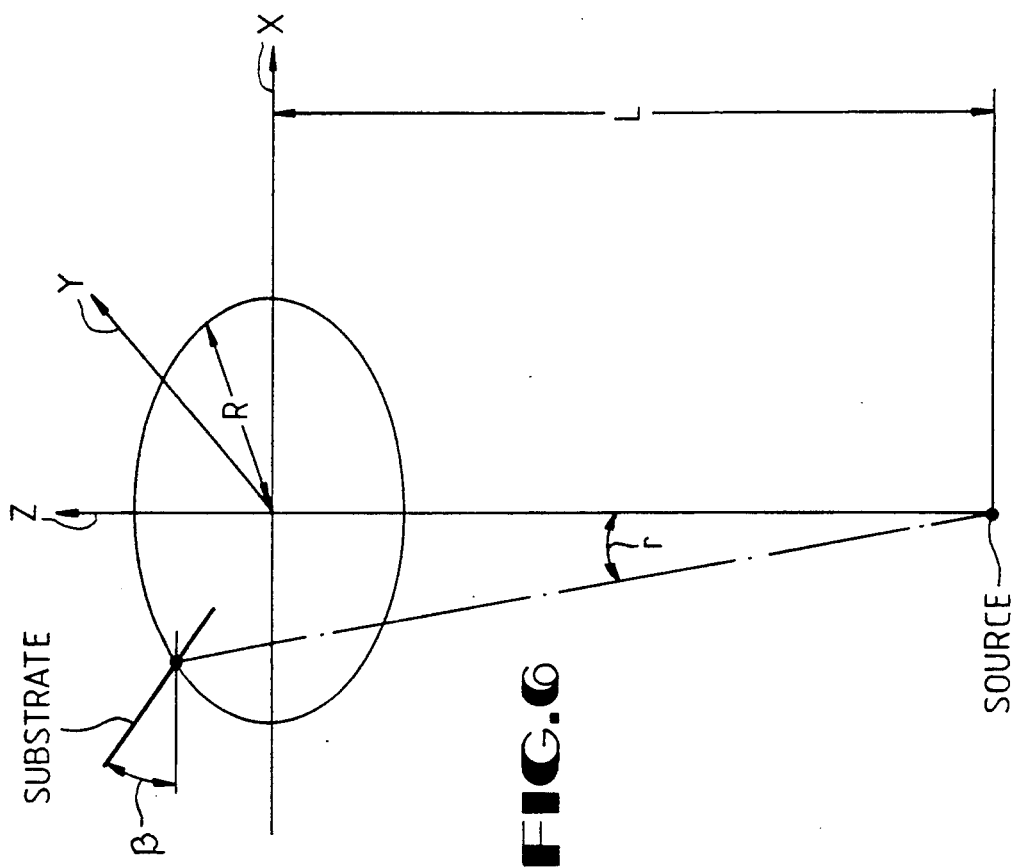
FIG. 6 is an illustration of the deposition setup to make the micro heat pipes of the present invention.

FIG. 6 illustrates the setup for the deposition step of making micro heat pipes. The configuration used for vapor deposition of micro heat pipes is a conical evaporator which is a simplified version of a planetary evaportor. The maximum distance between the source and substrate in a known deposition system is approximately 45 cm (18 inches). The angle $\Gamma$ may vary from about 15 degrees to about 60 degrees. The angle $\beta$ refers to the angle of the substrate with respect to the x-ray plane. The actual angle depends on the dimensions of the micro heat pipe, coating conditions, the selected distance R, the material to be coated, and other variables to be selected by those of skill in the art.

Next, one end of each of the heat pipes is sealed using a material, such as an appropriate glue, that has approximately the same thermal conductivity as the heat-conductive material of the micro heat pipe. Once the internal surfaces of the micro heat pipes have been cleaned, the entire device is placed in a vacuum chamber and evacuated. A small portion of liquid is then added to each micro heat pipe to partially fill the region in the corners of the pipes. This may be accomplished using appropriately sized, commercially available tubes and valves. Each micro heat pipe is then sealed to prevent the leakage of any of the working fluid. This results in a series of parallel channels embedded within the semiconductor. The fluid inside the pipes operates at the saturation temperature and pressure provided that the chip temperature is above the normal freezing point of the working fluid and below the critical temperature of the working fluid.

Alternatively, once the internal surfaces of the pipes have been cleaned, the device is immersed in a bath of the working fluid that is in an evacuated chamber. Depending on the working fluid chosen, the working fluid may begin to boil when the chamber is evacuated. Capillary action of the pipes fills the pipes with the working fluid. One end of each of the pipes is then sealed with an appropriate material as described before. The bath is then heated causing a controlled evaporation of the fluid in the pipes. Knowing the rate of Joule heating, the amount of evaporation can be finely controlled. When the liquid volume is about 20% and the vapor volume is about 80%, the ends of the pipes are sealed to formed a completely enclosed pipe with the proper amount of the working fluid inside. The percent volume of liquid and vapor may vary depending on the selected working fluid and the dimensions of the micro heat pipe.

FIGS. 2 and 3 illustrate the operation of the micro heat pipe of the present invention. Heat, shown diagrammatically in FIG. 2 as a set of arrows 14, resulting from the electronic activation of the semiconductor devices located on the front side of the semiconductor chip, is conducted via the chip material to a portion of the micro heat pipe. This results in vaporization of the working fluid, a high temperature at that portion of the micro heat pipe and hence a high pressure, the movement of vapor towards a cooler region of the micro heat pipe, the condensation of the working fluid, and finally the rejection of heat, shown as a set of arrows 16, as the working fluid condenses. The corners of the pipes provide a return path for the flow of the working fluid.

The present invention has been described as being completely contained within a semiconductor substrate. Alternatively, the micro heat pipes may extend out the ends of the semiconductor device and a cooling fluid such as air, water, Freon, or other coolant passed over the ends of the micro heat pipes to remove heat from the chip. In this way, heat can be collected over entire semiconductor chip and either dissipated or removed entirely.

Figure 5:
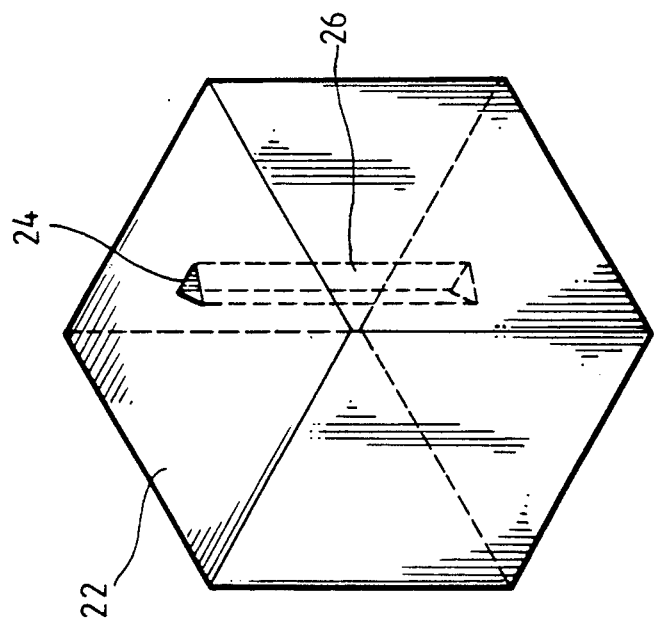
FIG. 5 is a three dimensional diagram of a vertical heat pipe in a semiconductor device.

FIG. 5 illustrates another embodiment of a micro heat pipe of the present invention. The mircro heat pipe of this embodiment extends vertically from the surface 22 of the semiconductor (the backside of the semiconductor chip) toward the surface containing an integrated circuit (the frontside of the semiconductor chip). Using well known photolithographic techniques, a triangular shaped portion 24 of the surface of the semiconductor material is exposed, available for etching. Then using an appropriate anisotropic etching method, such as reactive ion etching (RIE), a micro heat pipe 26 is etched into the material. The micro heat pipe may preferably extend about 125 micrometers into the material but should not go all the way through. In this way, one end of the micro heat pipe remains sealed.

Next, the micro heat pipe is thermally oxidized to a depth of about 0.5 micrometers to seal the surface of the micro heat pipe. This avoids possible migration of working fluid into the material. Finally, the micro heat pipe is charged with a working fluid and sealed as before.

An advantage of a vertical heat pipe is that it reduces the possibility of cracking of the semiconductor chip that may be possible using a horizontal heat pipe. A verical heat pipe conducts heat from the integrated circuit components on one surface of the chip or wafer to a point near a natural heat sink on the other surface of the chip or wafer. Finally, circuit designers may choose to use a number of vertical heat pipes, each near a troublesome hot spot on the chip.

Although the invention has been described with reference to specific embodiments, these embodiments should not be construed as limiting the scope of the invention. It will be clear to those skilled in the art with the benefit of this disclosure that certain modifications can be made without deviating from the spirit of the invention.

We claim:

1. A method of forming a micro heat pipe, comprising the steps of:
    a. forming a groove in a semiconductor substrate, the groove having a top;
    b. vapor depositing a heat conductive material until the top of the groove is sealed, thereby forming a tube in the groove, the tube having ends;
    c. charging a working fluid into the tube to fill a fraction of the tube; and
    d. sealing the ends of the tube.

2. A method of redistributing heat in a semiconductor device containing an integrated circuit, comprising the steps of:
    a. forming a groove in the surface of the semiconductor opposite the integrated circuit;
    b. vapor depositing a heat conductive material until a micro heat pipe is formed, the heat pipe having ends;
    c. sealing one end of the heat pipe;
    d. evacuating the micro heat pipe;
    e. charging a fraction of the micro heat pipe with a working fluid; and
    f. sealing the other end of the micro heat pipe.

3. A method of redistributing heat in a semiconductor device containing an integrated circuit, comprising the steps of:
    a. forming a groove in the surface of the semiconductor opposite the integrated circuit;
    b. vapor depositing a heat conductive material until a micro heat pipe is formed, the heat pipe having ends;
    c. immersing the semiconductor in a bath of the working fluid, thereby filling the micro heat pipe with the working fluid;
    d. sealing one end of the heat pipe;
    e. heating the bath a controlled amount until approximately 20% of the working fluid within the micro heat pipe remains in the liquid phase; and
    f. sealing the other end of the micro heat pipe.

* * * * *